(12) United States Patent
Sato

(10) Patent No.: US 7,868,355 B2
(45) Date of Patent: Jan. 11, 2011

(54) HETERO FIELD EFFECT TRANSISTOR AND MANUFACTURING METHOD THEREOF

(75) Inventor: Ken Sato, Saitama (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 12/390,257

(22) Filed: Feb. 20, 2009

(65) Prior Publication Data

US 2009/0212325 A1    Aug. 27, 2009

(30) Foreign Application Priority Data

Feb. 25, 2008   (JP) .............................. 2008-042701

(51) Int. Cl.
H01L 31/0328 (2006.01)
H01L 31/0336 (2006.01)
H01L 31/072 (2006.01)
H01L 31/109 (2006.01)

(52) U.S. Cl. ................. 257/192; 257/194; 257/196; 257/E29.246

(58) Field of Classification Search ......... 257/192–196, 257/E29.246
See application file for complete search history.

(56) References Cited

U.S. PATENT DOCUMENTS

2007/0170463 A1 * 7/2007 Ueno et al. ................. 257/192

FOREIGN PATENT DOCUMENTS

JP   2006339561   12/2006
JP   2007019309   1/2007

* cited by examiner

Primary Examiner—Thien F Tran
(74) Attorney, Agent, or Firm—Wilmer Cutler Pickering Hale and Dorr LLP

(57) ABSTRACT

A hetero field effect transistor includes: a main semiconductor region including a first semiconductor layer and a second semiconductor layer formed thereon to allow a generation of a two-dimensional carrier gas layer of a first conductive type on a heterojunction interface therebetween; a source electrode formed on the main semiconductor region; a drain electrode formed on the main semiconductor region and separated from the source electrode; a third semiconductor layer of a second conductive type different from the first conductive type, the third semiconductor layer being formed on the second semiconductor layer and located between the source electrode and the drain electrode; and a gate electrode formed on the third semiconductor layer. A concave portion is formed in an upper surface of the second semiconductor layer at a region immediately below the gate electrode.

4 Claims, 3 Drawing Sheets

HETERO FIELD EFFECT TRANSISTOR AND MANUFACTURING METHOD THEREOF

CROSS-REFERENCE TO RELATED APPLICATIONS

This application is based upon and claims priority from Japanese Patent Application No. 2008-042701 filed on Feb. 25, 2008, the entire contents of which are incorporated herein by reference.

BACKGROUND OF THE INVENTION

1. Technical Field

The present invention relates to a normally-off Hetero Field Effect Transistor (HFET) and a method of manufacturing the HFET.

2. Description of the Related Art

A related-art HFET includes: a semiconductor substrate made of SiC (or Si, GaN, sapphire or the like); a buffer layer made of AlN formed on the semiconductor substrate; an electron transit layer made of non-doped GaN formed on the buffer layer; an electron supply layer formed on the electron transit layer and made of a non-doped AlGaN layer or laminated layers including a non-doped AlGaN; an insulating film made from $SiO_x$ (x is an integer from 1 to 2), which is formed on the electron supply layer and a part of which is opened; and a gate electrode, a source electrode, and a drain electrode which are formed on the electron supply layer. Here, the term "non-doped" means that an impurity is not intentionally introduced into a semiconductor layer.

A band gap of AlGaN is larger than that of GaN, and a lattice constant of AlGaN is smaller than that of GaN. As a result, when the electron supply layer made of AlGaN is formed on the electron transit layer made of GaN, a tensile stress is acted on the electron supply layer and piezoelectric (voltage) depolarization occurs. Since spontaneous depolarization also occurs in the electron supply layer, an electric field caused by the piezoelectric depolarization and the spontaneous depolarization is acted on a heterojunction interface between the electron transit layer and the electron supply layer, and thus a carrier layer called as a two dimensional electron gas (2DEG) layer occurs. The 2DEG layer is used as a channel, and thus the HFET is used as a switching element which can control electron flow from the drain electrode to the source electrode through the channel therebetween.

On the other hand, in the HFET, since an energy level in the heterojunction interface between the electron transit layer and the electron supply layer is equal to or less than the Fermi level, a normally-on (depletion mode) characteristic of a negative threshold value appears. However, for example, in a semiconductor device which is applied to a power supply apparatus as a power semiconductor element, it is necessary to be a normally-off (enhancement mode) type of a positive threshold value for ensuring the safety in a malfunction. JP-A-2006-339561 describes a field effect transistor of normally-off type.

FIG. 6 is a cross-sectional view illustrating the HFET which uses a GaN-based material and has the normally-off characteristic. The HFET includes: a semiconductor substrate 101 which is made of SiC; a buffer layer 102 formed on the semiconductor substrate 101 and made of AlN; an electron transit layer 103 formed on the buffer layer 102 and made of non-doped GaN; an electron supply layer 104 formed on the electron transit layer 103 and made of non-doped AlGaN; a p-type semiconductor layer 105 formed on a part of the electron supply layer 104 and made of a p-type GaN; a high concentration p-type semiconductor layer 106 formed on the p-type semiconductor layer 105 and made of a high concentration p-type GaN; an insulating film 107 made of $SiO_x$ and formed on the electron supply layer 104, side surfaces of the p-type semiconductor layer 105, and upper surface and side surfaces of the high concentration p-type semiconductor layer 106, and a part of the insulating film 107 is opened; a gate electrode 108 made of Pd, formed on the high concentration p-type semiconductor layer 106 and is in ohmic contact with the high concentration p-type semiconductor layer 106; and a source electrode 109 and a drain electrode 110 made of Ti and Al, being separately formed on the electron supply layer 104 so as to interpose the p-type semiconductor layer 105.

Since the p-type semiconductor layer 105 made of the p-type GaN is formed on the electron supply layer 104 immediately below the gate electrode 108, the energy levels of the electron transit layer 103 and the electron supply layer 104 are increased, and thus the HFET having the normally-off characteristic is obtained.

In order to more easily obtain a normally-off property in the HFET having the p-type gate structure, it is necessary to form the electron supply layer to be thinner, or to lower an Al combination ratio (mole fraction) in AlGaN which constitutes the electron supply layer. The both of the methods described above can easily provide a normally-off property, but reduce carrier concentration of the 2DEG layer. Therefore, the on-resistance is increased.

BRIEF SUMMARY OF THE INVENTION

The present invention was made in consideration of the above circumstances, and an object of the present invention is to provide a Hetero Field Effect Transistor (HFET) capable of easily obtaining a normally off property and reducing the on-resistance.

According to a first aspect of the invention, there is provided a hetero field effect transistor comprising: a main semiconductor region comprising a first semiconductor layer and a second semiconductor layer formed on the first semiconductor layer to allow a generation of a two-dimensional carrier gas layer of a first conductive type on a heterojunction interface between the first semiconductor layer and the second semiconductor layer; a source electrode formed on the main semiconductor region; a drain electrode formed on the main semiconductor region and separated from the source electrode; a third semiconductor layer of a second conductive type different from the first conductive type, the third semiconductor layer being formed on the second semiconductor layer and located between the source electrode and the drain electrode; and a gate electrode formed on the third semiconductor layer; wherein a concave portion is formed in an upper surface of the second semiconductor layer at a region immediately below the gate electrode.

According to a second aspect of the invention, there is provided a hetero field effect transistor comprising: a main semiconductor region comprising a first semiconductor layer and a second semiconductor layer formed on the first semiconductor layer to allow a generation of a two-dimensional carrier gas layer of a first conductive type on a heterojunction interface between the first semiconductor layer and the second semiconductor layer; a source electrode formed on the main semiconductor region; a drain electrode formed on the main semiconductor region and separated from the source electrode; a third semiconductor layer of a second conductive type different from the first conductive type, the third semiconductor layer being formed on a second semiconductor layer and located between the source electrode and the drain electrode; a gate electrode formed on the third semiconductor layer; and a diffusion layer of the second conductive type formed on the second semiconductor layer at a region immediately below the gate electrode.

According to a third aspect of the invention, there is provided a method of manufacturing a hetero field effect transistor that comprises: a main semiconductor region comprising a first semiconductor layer and a second semiconductor layer formed on the first semiconductor layer to allow a generation of a two-dimensional carrier gas layer on a heterojunction interface between the first semiconductor layer and the second semiconductor layer; a source electrode formed on the main semiconductor region; a drain electrode formed on the main semiconductor region and separated from the source electrode; a third semiconductor layer of a second conductive type different from the first conductive type, the third semiconductor layer being formed on the second semiconductor layer and located between the source electrode; and a gate electrode formed on the third semiconductor layer; wherein a concave portion is formed in an upper surface of the second semiconductor layer at a region immediately below the gate electrode, said method comprising: etching the second semiconductor layer to form the concave portion in the upper surface of the second semiconductor layer, and thereafter forming the third semiconductor layer.

According to a fourth aspect of the invention, there is provided a method of manufacturing a hetero field effect transistor that comprises: a main semiconductor region comprising a first semiconductor layer and a second semiconductor layer formed on the first semiconductor layer to allow a generation of a two-dimensional carrier gas layer on a heterojunction interface between the first semiconductor layer and the second semiconductor layer; a source electrode formed on the main semiconductor region; a drain electrode formed on the main semiconductor region and separated from the source electrode; a third semiconductor layer of a second conductive type different from the first conductive type, the third semiconductor layer being formed on a second semiconductor layer and located between the source electrode and the drain electrode; a gate electrode formed on the third semiconductor layer; and a diffusion layer of the second conductive type formed on the second semiconductor layer at a region immediately below the gate electrode, said method comprising: forming the third semiconductor layer on the second semiconductor layer by a crystal growth, and thereafter diffusing an impurity of the second conductive type into the third semiconductor layer to form the diffusion layer.

DETAILED DESCRIPTION OF THE EMBODIMENT

Next, an example of a semiconductor device and a method of manufacturing the same according to embodiments of the present invention will be described with reference to FIGS. 1 to 5.

Figure 1:
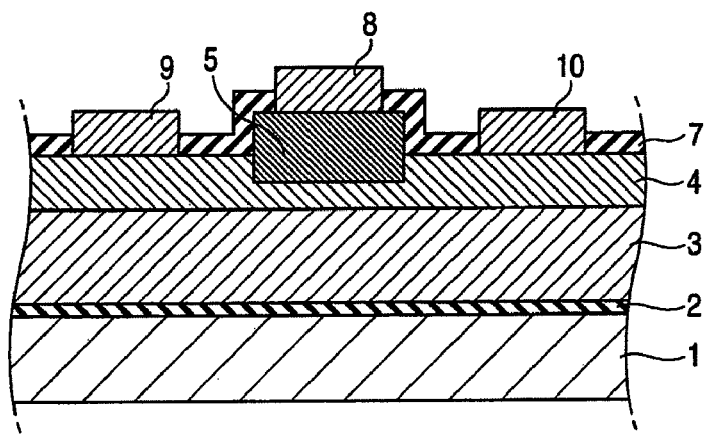
FIG. 1 is a cross-sectional view illustrating structure of an HFET according to a first embodiment of the present invention.

FIG. 1 is a cross-sectional view illustrating structure of a semiconductor device according to a first embodiment of the present invention. The semiconductor device shown in FIG. 1 includes: a semiconductor substrate 1 made of SiC; a buffer layer 2 made of AlN and formed on the semiconductor substrate 1; an electron transit layer 3 (an example of a first semiconductor layer) made of non-doped GaN and formed on the buffer layer 2; an electron supply layer 4 (an example of a second semiconductor layer) made of non-doped AlGaN and formed on the electron transit layer 3; a p-type semiconductor layer 5 (an example of a third semiconductor layer) made of p-type AlGaN and formed on a part of the electron supply layer 4; an insulating film 7 made of SiOx (x is an integer from 1 to 2) and formed on the electron supply layer 4 and upper and side surfaces of the p-type semiconductor layer 5, and a part of the insulating film 7 being opened; a gate electrode 8 made of Pd, formed on the p-type semiconductor layer 5, and forming a schottky junction with the p-type semiconductor layer 5 in an opening of the insulating film 7; and a source electrode 9 and a drain electrode 10 which are made of Ti and Al, and separated from each other on the electron supply layer 4 so as to interpose the p-type semiconductor layer 5.

The electron transit layer and the electron supply layer forms a main semiconductor region. An interface between the electron transit layer 3 and the electron supply layer 4 forms a heterojunction, and a two dimensional carrier layer such as 2DEG layer can be generated based on the heterojunction.

In the semiconductor device according to the first embodiment of the present invention, a thickness of the electron supply layer 4 at a region immediately below the gate electrode 8 is thinner than a thickness of the electron supply layer 4 at regions immediately below the source electrode 9 and the drain electrode 10.

Figure 2A:
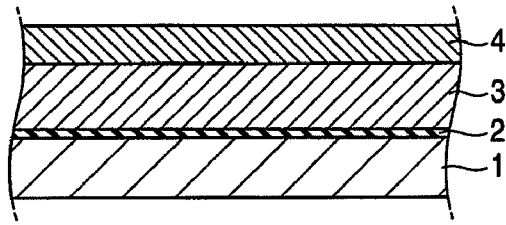
FIGS. 2A to 2D are cross-sectional views illustrating processes of a manufacturing method of the HFET according to the first embodiment of the present invention.

FIGS. 2A to 2D are cross-sectional views illustrating processes of a manufacturing method of the semiconductor device according to the first embodiment of the present invention. First, as shown in FIG. 2A, the buffer layer 2 made of AlN, the electron transit layer 3 made of GaN, and the electron supply layer 4 made of AlGaN are formed in this order on the semiconductor substrate 1 by epitaxial growth.

Figure 2B:
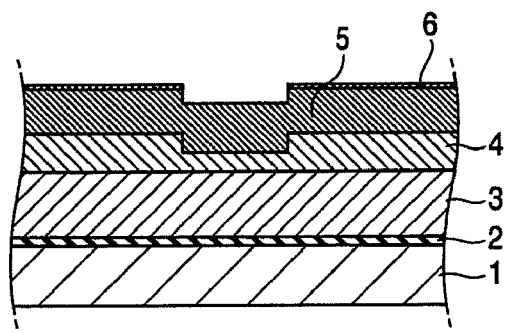

Next, as shown in FIG. 2B, a part of the electron supply layer 4 is thinned to form a recess (concave portion) shape by a dry etching, and thereafter the p-type semiconductor layer 5 made of p-type AlGaN is formed on the electron supply layer 4 by the epitaxial growth.

Figure 2C:
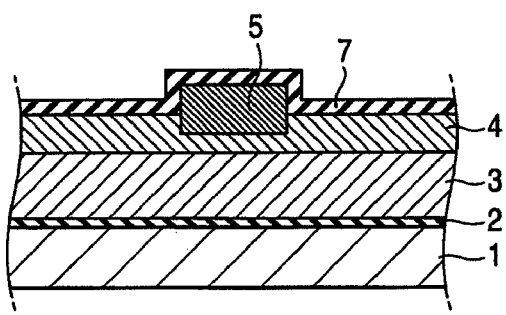

Next, as shown in FIG. 2C, a part of the p-type semiconductor layer 5 is removed by the dry etching so as to leave at least a portion on which the gate electrode 8 is formed (e.g., a portion corresponding to the recess), and then the impurity of the p-type semiconductor layer 5 is activated by a thermal process, and then the insulating film 7 is formed on the electron supply layer 4 and the upper and side surfaces of the p-type semiconductor layer 5 by the epitaxial growth.

Figure 2D:
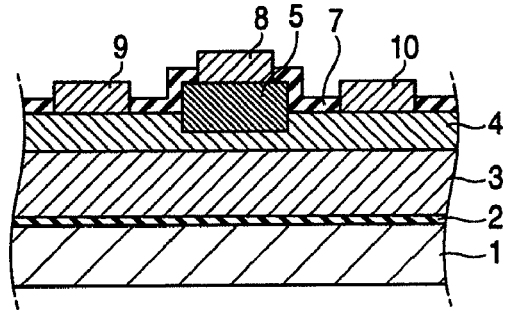

Next, as shown in FIG. 2D, a part of the insulating film 7 is opened by the dry etching, and the gate electrode 8, the source electrode 9, and the drain electrode 10 are formed.

Here, the gate electrode 8, the source electrode 9, and the drain electrode 10 may be formed earlier than the insulating film 7. In addition, the epitaxial growth method may use the MOCVD method, the MBE method, or the like, and the dry etching may use the ICP (Inductive-Coupled Plasma) method or the like. In addition, the semiconductor device may be formed by a method including: after forming the electron supply layer 4, forming a mask made of an oxide film; removing at least a part of the mask located immediately below the gate electrode 8; forming the recess (concave portion) shape on the electron supply layer 4 by the dry etching; and forming the p-type semiconductor layer 5. In this case, the p-type semiconductor layer 5 can be selectively formed only on the electron supply layer 4 on which the mask is removed.

According to the semiconductor device of the first embodiment of the present invention, the electron supply layer 4 is relatively thin at a position thereof immediately below the gate electrode 8, which can reduce the carrier concentration of the two-dimensional electron gas (2DEG) generated immediately below the gate electrode 8. Moreover, the p-type semiconductor layer 5 can increase the energy levels of the electron transit layer and the electron supply layer, which provides the normally-off characteristic. In addition, the electron supply layer 4 is relatively thick at a position thereof other than the position immediately below the gate electrode 8, which can increase the carrier concentration of the 2DEG so that a channel resistance can be decreased.

In the semiconductor device according to the first embodiment of the present invention, the thickness of the buffer layer 2 is 100 nm; the thickness of the electron transit layer 3 is 2 μm; the thickness of the electron supply layer 4 is 25 nm; the thicknesses of the electron supply layer 4 at a position immediately below the gate electrode 8 is 10 nm; the thickness of the p-type semiconductor layer 5 is 100 nm; and the impurity concentration of the p-type semiconductor layer 5 is $1 \times 10^{19}$ cm$^{-3}$.

Figure 3:
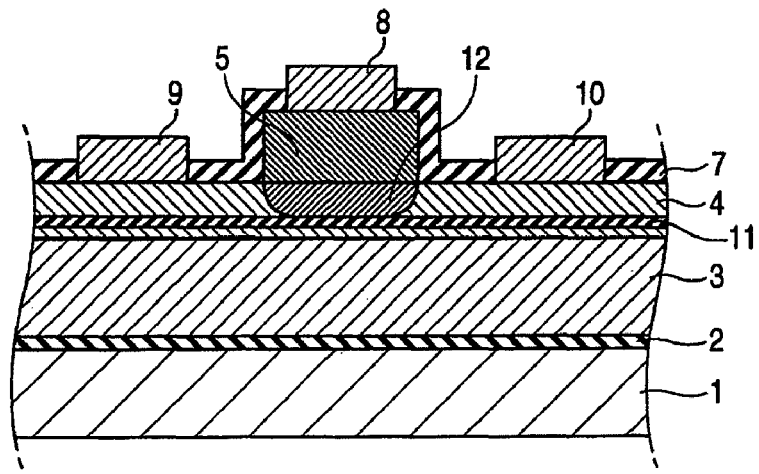
FIG. 3 is a cross-sectional view illustrating structure of an HFET according to a second embodiment of the present invention.

FIG. 3 is a cross-sectional view illustrating a semiconductor device according to a second embodiment of the present invention. The semiconductor device shown in FIG. 3 includes: a semiconductor substrate 1 made of SiC; a buffer layer 2 made of AlN and formed on the semiconductor substrate 1; an electron transit layer 3 (an example of a first semiconductor layer) made of non-doped GaN and formed on the buffer layer 2; an electron supply layer 4 (an example of a second semiconductor layer) made of non-doped AlGaN and formed on the electron transit layer 3; a p-type semiconductor layer 5 (an example of a third semiconductor layer) made of p-type AlGaN and formed on a part of the electron supply layer 4; an insulating film 7 made of SiOx and formed on the electron supply layer 4 and upper and side surfaces of the p-type semiconductor layer 5, and a part of the insulating film 7 being opened; a gate electrode 8 made of Pd, being formed on the p-type semiconductor layer 5, and forming the schottky junction with the p-type semiconductor layer 5 in an opening of the insulating film 7; a source electrode 9 and a drain electrode 10 which are made of Ti and Al, and separated from each other on the electron supply layer 4 so as to interpose the p-type semiconductor layer 5; a diffusion prevention layer 11 (an example of a fourth semiconductor layer) made of AlN and formed on or above the electron transit layer 3; and a p-type impurity diffusion layer 12 formed on the electron supply layer 4 and located at a region immediately below of the gate electrode 8.

The semiconductor device according to the second embodiment of the present invention is different from the first embodiment in that the diffusion prevention layer 11 is formed on the electron transit layer 3, and the p-type impurity diffusion layer 12 is formed on the electron supply layer 4 and located immediately below of the gate electrode 8.

Figure 4A:
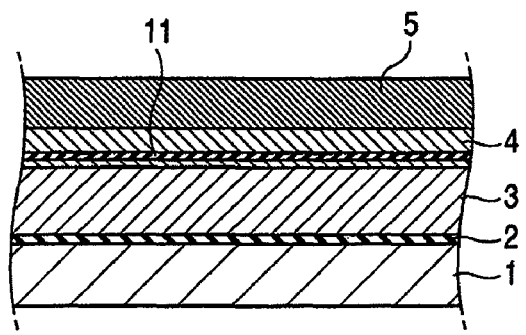
FIGS. 4A to 4D are cross-sectional views illustrating processs of a manufacturing method of the HFET according to the second embodiment of the present invention.

FIGS. 4A to 4D are cross-sectional views illustrating processes of a manufacturing method of the semiconductor device according to the second embodiment of the present invention. Firstly, as shown in FIG. 4A, the buffer layer 2 made of AlN and the electron transit layer 3 made of GaN are formed in this order on the semiconductor substrate 1 by epitaxial growth. Next, the diffusion prevention layer 11 made of AlN, the electron supply layer 4 made of AlGaN, and the p-type semiconductor layer 5 made of AlGaN are formed in this order by the epitaxial growth. However, the diffusion prevention layer 11 may be formed above the electron transit layer 3 and at a position where the 2DEG generated at a region immediately below the gate electrode 8 is canceled by the p-type semiconductor layer 5.

Figure 4B:
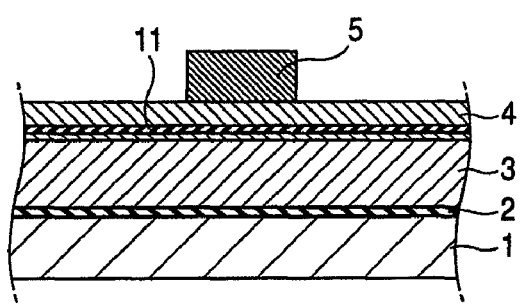

Next, as shown in FIG. 4B, a part of the p-type semiconductor layer 5 is removed by the dry etching in order to remain a portion in which the gate electrode 8 is formed.

Figure 4C:
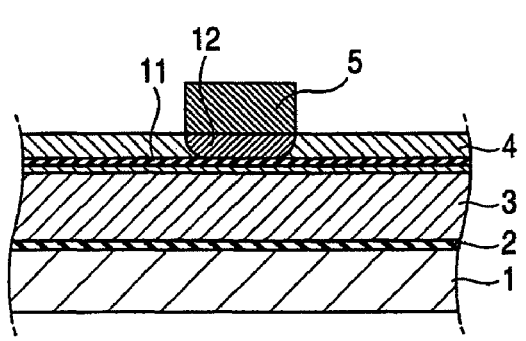

Next, as shown in FIG. 4C, the p-type impurity is diffused from the p-type semiconductor layer 5 to the electron supply layer 4 by using thermal diffusion, thereby forming the diffusion layer 12.

Figure 4D:
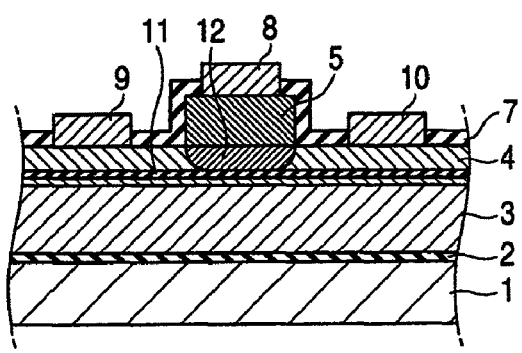

Next, as shown in FIG. 4D, the insulating film 7 is formed by the epitaxial growth, and the insulating film 7 is opened as described in the first embodiment, and the gate electrode 8, the source electrode 9, and the drain electrode 10 are formed.

Here, the semiconductor device may be formed by a method including: after forming the electron supply layer 4, forming a mask made of an oxide film; removing at least a part of the mask located immediately below the gate electrode 8 by the dry etching; and forming the p-type semiconductor layer 5. In this case, the p-type semiconductor layer 5 can be selectively formed only on the electron supply layer 4 in which the mask is removed. In addition, the diffusion prevention layer 11 may be formed of AlGaN which has an Al combination ratio (mole fraction) higher than that of the electron supply layer 4. In addition, as described in the first embodiment, it is possible to be operated as the HFET of the hole injection type.

According to the semiconductor device of the second embodiment of the present invention, since the electron supply layer 4 is relatively thin at a position thereof immediately below the gate electrode 8, and the other portions of the electron supply layer 4 are formed relatively thicker, the same effect as that of the first embodiment is obtained. In addition, since the diffusion prevention layer 11 has a diffusion coefficient of the p-type impurity smaller than that of the electron supply layer 4 and can suppress the impurity diffusion from the p-type semiconductor layer 5, a depth of the diffusion layer 12 can be easily controlled by forming the diffusion layer 12 so as to reach the diffusion prevention layer 11. Furthermore, since the etching is not performed to the electron supply layer 4 located immediately below the gate electrode 8, a damage layer is not formed in an interface between the electron supply layer 4 and the p-type semiconductor layer 5, which stabilizes the characteristics and therefore improves a production yield.

In the semiconductor device according to the second embodiment of the present invention, the thickness of the diffusion prevention layer 11 is 5 nm, and the thickness of the diffusion layer 12 is 10 nm, and the other are formed in a similar way to the first embodiment.

Figure 5:
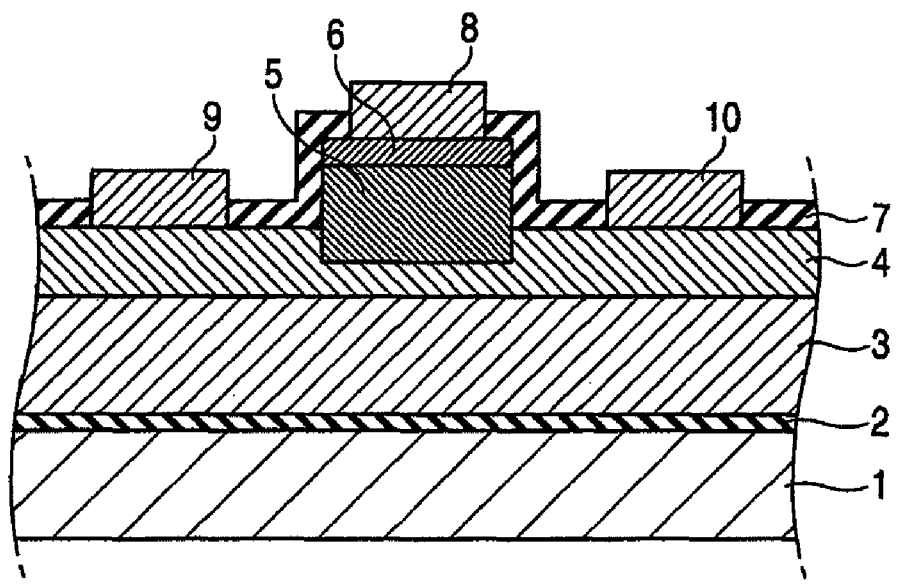
FIG. 5 is a cross-sectional view illustrating a structure of an HFET according to another example of the embodiments of the present invention.
Figure 6:
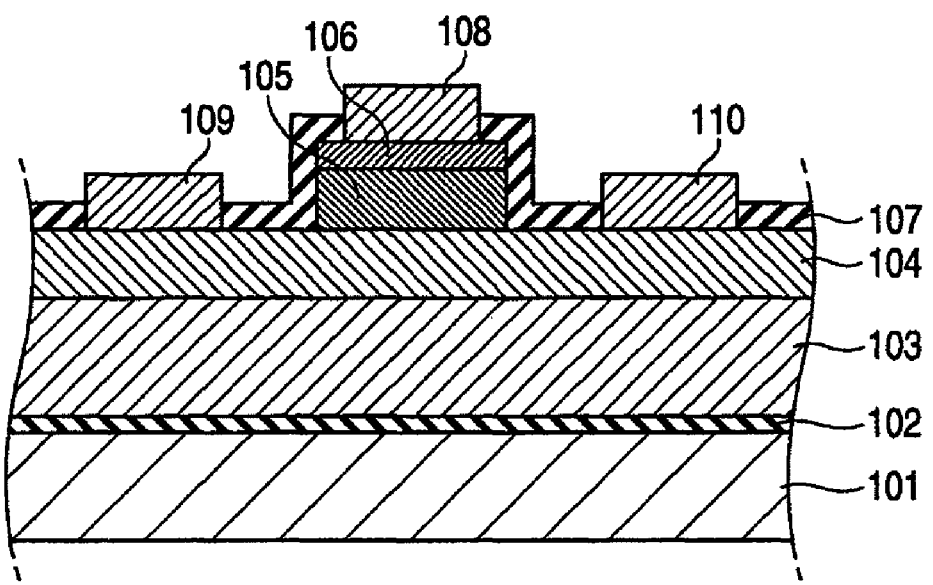
FIG. 6 is a cross-sectional view illustrating a structure of a related-art HFET.

The HFET of the present invention is not limited to the above-mentioned embodiments, but various changes can be made. For example, the semiconductor substrate 1 may include Si, GaN, or sapphire. The buffer layer 2 may include a multilayered semiconductor layer which includes an AlN layer. The buffer layer 2 is not a nitride semiconductor such as GaN etc., but may include a compound semiconductor such as GaAs, InP, or the like. In addition, as shown in FIG. 5, a high concentration p-type semiconductor layer 6 made, e.g., of GaN may be formed on the p-type semiconductor layer 5, and the high concentration p-type semiconductor layer 6 may come into ohmic contact with the gate electrode 8. In this case, it is possible to be operated as the HFET of the hole injection type. In addition, the insulating film 7 may be formed of SiNx (x is an integer from 1 to 2). In addition, the source electrode 9 and the drain electrode 10 may be electrically connected to the electron supply layer 4.

According to the embodiments of the invention, since carrier concentration of the 2DEG at a region immediately below the gate electrode can be lowered, it is possible to obtain compatibility between a sufficient normally-off characteristic and a low on-resistance of the HFET.

What is claimed is:

1. A hetero field effect transistor comprising:
    a main semiconductor region comprising a first semiconductor layer and a second semiconductor layer formed on the first semiconductor layer to allow a generation of a two-dimensional carrier gas layer of a first conductive type on a heterojunction interface between the first semiconductor layer and the second semiconductor layer;
    a source electrode formed on the main semiconductor region;
    a drain electrode formed on the main semiconductor region and separated from the source electrode;
    a third semiconductor layer of a second conductive type different from the first conductive type, the third semiconductor layer being formed on a second semiconductor layer and located between the source electrode and the drain electrode;
    a fourth semiconductor layer formed on or above the first semiconductor layer and made of a compound semiconductor which has a diffusion coefficient smaller than that of the second semiconductor layer;
    a gate electrode formed on the third semiconductor layer; and
    a diffusion layer of the second conductive type formed on the second semiconductor layer at a region immediately below the gate electrode.

2. The hetero field effect transistor according to claim 1, wherein the fourth semiconductor layer is formed in the second semiconductor layer.

3. The hetero field effect transistor according to claim 1, wherein the first semiconductor layer is thicker than the second semiconductor layer.

4. The hetero field effect transistor according to claim 1, wherein the diffusion layer is adjacent to the second semiconductor layer.

* * * * *